(12) United States Patent
Kosaka et al.

(10) Patent No.: US 12,213,301 B2
(45) Date of Patent: Jan. 28, 2025

(54) SEMICONDUCTOR DEVICE AND SEMICONDUCTOR STORAGE DEVICE

(71) Applicant: KIOXIA CORPORATION, Tokyo (JP)

(72) Inventors: Takao Kosaka, Yokohama Kanagawa (JP); Hideto Horii, Yokohama Kanagawa (JP); Hiroki Tokuhira, Kawasaki Kanagawa (JP); Kazuya Matsuzawa, Kamakura Kanagawa (JP); Hiroki Kawai, Inazawa Aichi (JP)

(73) Assignee: Kioxia Corporation, Tokyo (JP)

( * ) Notice: Subject to any disclaimer, the term of this patent is extended or adjusted under 35 U.S.C. 154(b) by 452 days.

(21) Appl. No.: 17/681,853

(22) Filed: Feb. 28, 2022

(65) Prior Publication Data
US 2023/0091204 A1    Mar. 23, 2023

(30) Foreign Application Priority Data

Sep. 17, 2021    (JP) .................................. 2021-152181

(51) Int. Cl.
*H01B 12/00* (2006.01)
*G11C 11/4091* (2006.01)
(Continued)

(52) U.S. Cl.
CPC .......... *H10B 12/30* (2023.02); *G11C 11/4091* (2013.01); *H01L 29/66969* (2013.01);
(Continued)

(58) Field of Classification Search
CPC ........ H10B 12/30; H10B 12/03; H10B 12/05; H10B 12/50; G11C 11/4091; G11C 11/4097; G11C 11/404; H01L 29/66969; H01L 29/78642; H01L 29/7869; H01L 29/7881
(Continued)

(56) References Cited

U.S. PATENT DOCUMENTS 7,989,899 B2    8/2011    Yin et al.
2011/0069552 A1    3/2011    Itagaki et al.
(Continued)

FOREIGN PATENT DOCUMENTS

JP    2016-189463 A    11/2016
JP    2018-207133 A    12/2018
TW    202133406 A    9/2021

*Primary Examiner* — Mohammad M Hoque
(74) *Attorney, Agent, or Firm* — Kim & Stewart LLP

(57) ABSTRACT

A semiconductor device includes a first conductive layer extending along a first direction, a semiconductor layer extending along a second direction crossing the first direction, penetrating the first conductive layer, and including an oxide semiconductor, a first insulating layer between the first conductive layer and the semiconductor layer, a second conductive layer provided on one side of the semiconductor layer in the second direction and electrically connected thereto, a third conductive layer provided on the other side of the semiconductor layer in the second direction and electrically connected thereto, an electric conductor extending from the third conductive layer toward the second conductive layer along the semiconductor layer, and a charge storage film between the semiconductor layer and the electric conductor.

19 Claims, 17 Drawing Sheets

(51) Int. Cl.
    *H01L 29/66*     (2006.01)
    *H01L 29/786*     (2006.01)
    *H10B 12/00*     (2023.01)

(52) U.S. Cl.
    CPC .... *H01L 29/78642* (2013.01); *H01L 29/7869* (2013.01); *H10B 12/03* (2023.02); *H10B 12/05* (2023.02); *H10B 12/50* (2023.02)

(58) Field of Classification Search
    USPC .......................................................... 257/43
    See application file for complete search history.

(56) References Cited

U.S. PATENT DOCUMENTS

| | | |
|---|---|---|
| 2015/0008428 A1 | 1/2015 | Yamamoto et al. |
| 2016/0071593 A1 | 3/2016 | Hashimoto |
| 2016/0163389 A1* | 6/2016 | Zhang ................. H01L 29/7926 365/185.17 |
| 2016/0284857 A1 | 9/2016 | Yamazaki et al. |
| 2018/0269210 A1 | 9/2018 | Tezuka et al. |
| 2020/0098784 A1 | 3/2020 | Nagashima et al. |
| 2020/0220024 A1 | 7/2020 | Sharma et al. |
| 2021/0175253 A1* | 6/2021 | Han ....................... H10B 51/10 |
| 2021/0273055 A1 | 9/2021 | Yanai et al. |
| 2021/0398593 A1* | 12/2021 | Song ................... G11C 16/0483 |
| 2022/0037362 A1* | 2/2022 | Lin ....................... H01L 23/535 |
| 2022/0231049 A1* | 7/2022 | Lin ....................... H10B 51/20 |
| 2023/0410919 A1* | 12/2023 | Song ..................... H10B 41/27 |
| 2024/0274203 A1* | 8/2024 | Song ..................... H01L 29/51 |

\* cited by examiner

SEMICONDUCTOR DEVICE AND SEMICONDUCTOR STORAGE DEVICE

CROSS-REFERENCE TO RELATED APPLICATION

This application is based upon and claims the benefit of priority from Japanese Patent Application No. 2021-152181, filed Sep. 17, 2021, the entire contents of which are incorporated herein by reference.

FIELD

Embodiments described herein relate generally to a semiconductor device, a semiconductor storage device, and a method of manufacturing a semiconductor device.

BACKGROUND

Semiconductor storage devices including a plurality of bit lines and word lines and a plurality of memory cells (transistors and capacitors) formed therebetween are widely used. Data can be written and read to and from a memory cell when a corresponding bit line and a corresponding word line are selected and a particular voltage is applied to each line.

DETAILED DESCRIPTION

Figure 1:
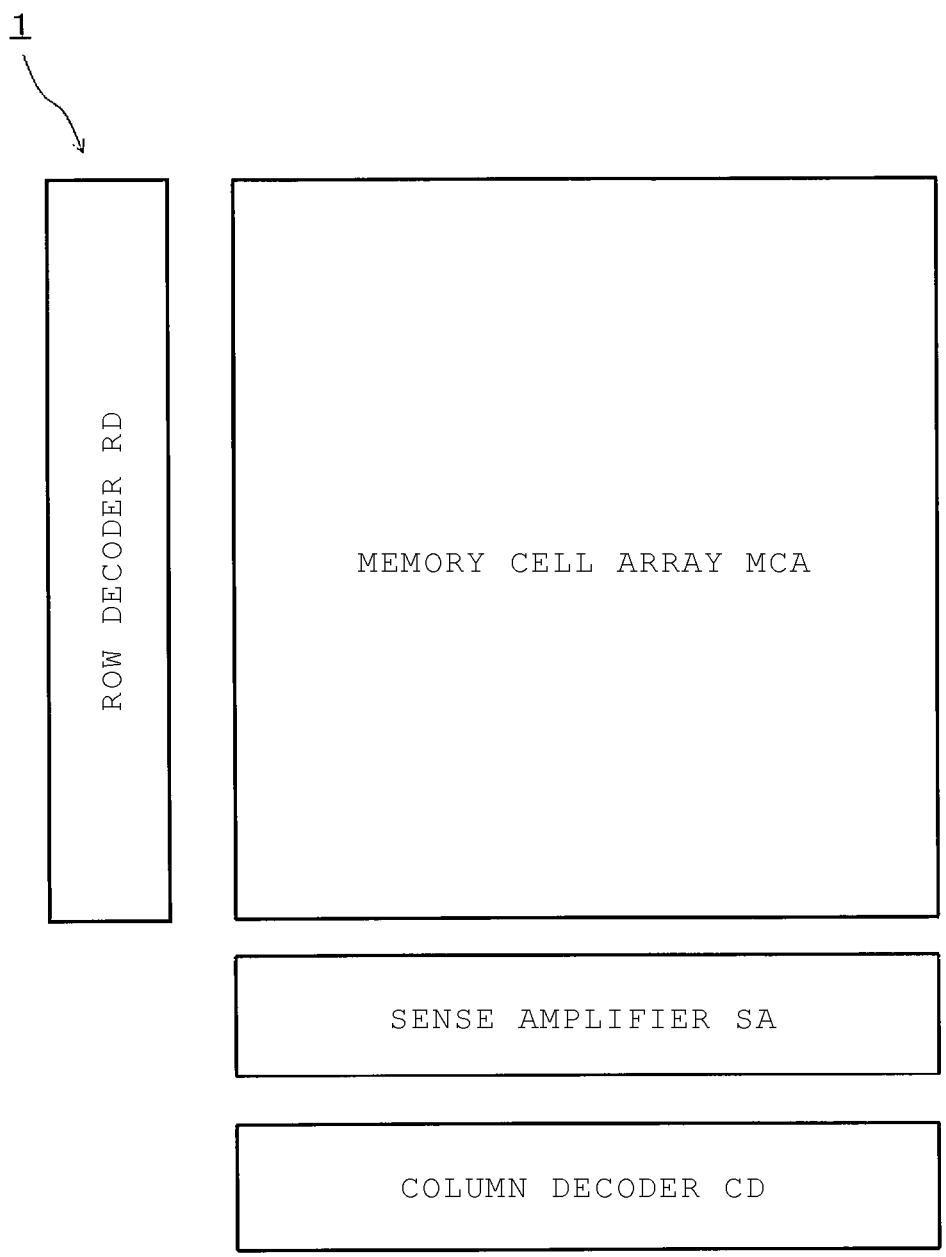
FIG. 1 is a block diagram of a semiconductor storage device.

Embodiments prevent operational malfunctions of a semiconductor device.

In general, according to one embodiment, a semiconductor device includes a first conductive layer extending along a first direction, a semiconductor layer extending along a second direction crossing the first direction, penetrating the first conductive layer, and including an oxide semiconductor, a first insulating layer between the first conductive layer and the semiconductor layer, a second conductive layer provided on one side of the semiconductor layer in the second direction and electrically connected thereto, a third conductive layer provided on the other side of the semiconductor layer in the second direction and electrically connected thereto, an electric conductor extending from the third conductive layer toward the second conductive layer along the semiconductor layer, and a charge storage film between the semiconductor layer and the electric conductor.

Hereinafter, certain example embodiments are described with reference to the drawings. The relationship between the thickness and the plane dimension of each depicted component, a ratio of the thickness of each depicted component, and the like illustrated in the drawings may differ from the actual product. Furthermore, in the present disclosure, components that substantially the same are designated by the same reference symbols, and repeated description of such components may be omitted as appropriate.

In addition, in this specification, a reference to a "connection" includes not only a physical connection but also electrical connection.

FIG. 1 is a block diagram of a semiconductor storage device 1. The semiconductor storage device 1 is a dynamic random access memory (DRAM), and includes a memory cell array MCA, a row decoder RD, a sense amplifier SA, and a column decoder CD.

Figure 2:
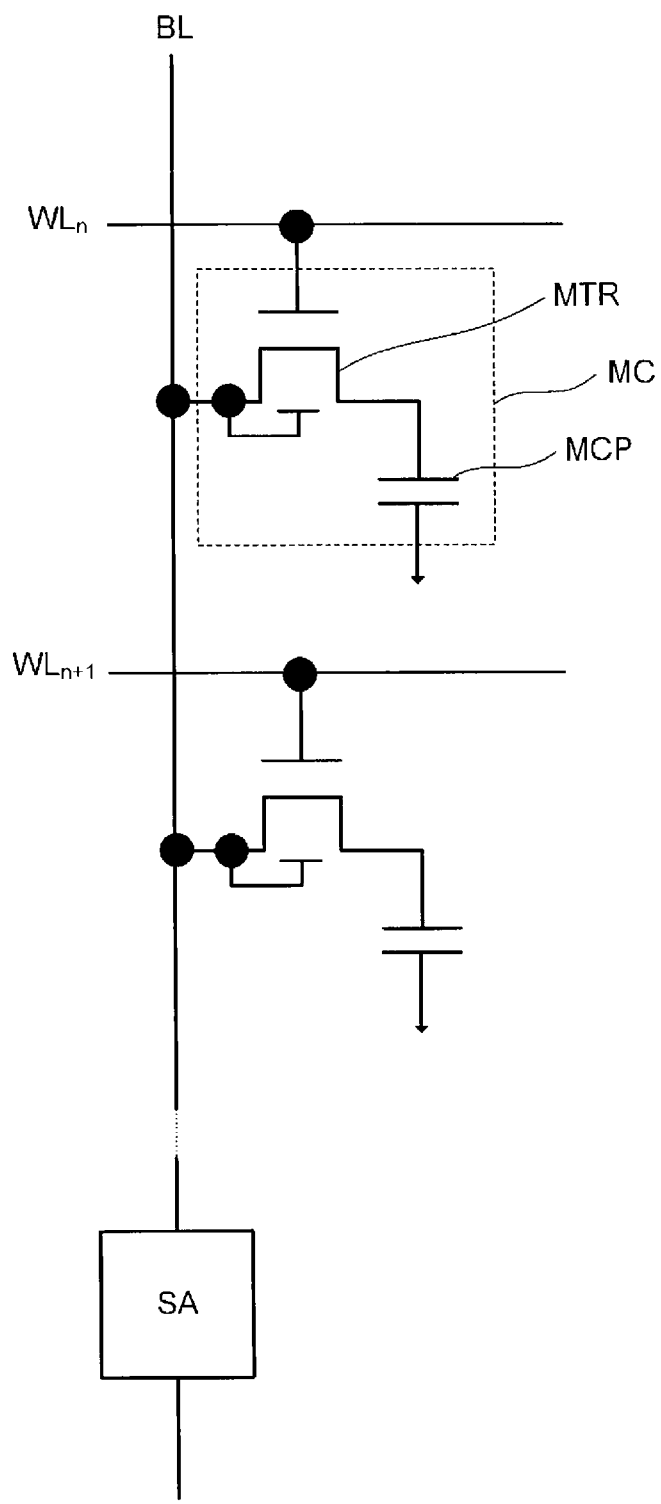
FIG. 2 is a circuit diagram of a memory cell array.

FIG. 2 is a circuit diagram of the memory cell array MCA. FIG. 2 illustrates a plurality of memory cells MC, a plurality of word lines WL (word lines $WL_n$ and $WL_{n+1}$ where n is an integer), a bit line BL, and the sense amplifier SA. The numbers of word lines WL and bit lines BL are not limited to the numbers as illustrated in FIG. 2.

The plurality of memory cells MC make up the memory cell array MCA. The memory cells MC each include a memory transistor MTR and a memory capacitor MCP. The number of memory cells MC is not limited to the number of the memory cells MC illustrated in FIG. 2.

The memory transistor MTR is a field effect transistor (FET). The gate of the memory transistor MTR is connected to a corresponding word line WL. One of the source or drain of the memory transistor MTR is connected to the corresponding bit line BL. The word lines WL are connected to the row decoder RD. The bit line BL is connected to the column decoder CD via the sense amplifier SA. The method of connecting the memory cells MC and the sense amplifier SA is not limited to the method illustrated in FIG. 2.

The memory transistor MTR further includes a back gate. The back gate of the memory transistor MTR is connected to one of the source or drain of the memory transistor MTR.

One electrode of the memory capacitors MCP is connected to the other one of the source or drain of the memory transistor MTR, and the other electrode is connected to a power line that applies a specific voltage. The electrodes face each other. The memory capacitor MCP may be a three-dimensional capacitor such as a pillar type capacitor or a cylinder type capacitor.

The memory cell MC can store electric charges in the memory capacitor MCP by supplying the electric charges from the bit line BL by switching the memory transistor MTR by the word line WL. In the write operation, a predetermined voltage is applied to the bit line BL by a write circuit. In the read operation, a predetermined voltage is applied to the bit line BL by a precharge circuit or another circuit.

The row decoder RD selects a corresponding memory cell MC based on a row address signal. The row decoder RD applied a voltage applied to the signal line, for example, corresponding to the word line WL that is selected, to the selected word line WL.

In the read operation, the sense amplifier SA reads data stored in the memory cell MC based on the potential of the bit line BL or the current flowing to the bit line BL and outputs the read data.

The column decoder CD selects a corresponding memory cell MC based on a column address signal. The column decoder CD transfers the output from the sense amplifier SA, for example, connected to the selected bit line BL to the outside as a data signal.

The column decoder CD includes, for example, a plurality of select transistors and a main amplifier. Each of the plurality of select transistors is a field effect transistor.

The gate of each select transistor is connected to the corresponding column selection line. One of the source or drain of each select transistor is connected to an output terminal of the corresponding sense amplifier SA.

An input terminal of the main amplifier is connected to the other of the source or drain of each select transistor. The output terminal of the main amplifier is connected to an external wiring. The configuration of the column decoder CD is not limited to the above configuration.

(First Modification of Method of Connecting Memory Cells MC and Sense Amplifiers SA)

Figure 3:
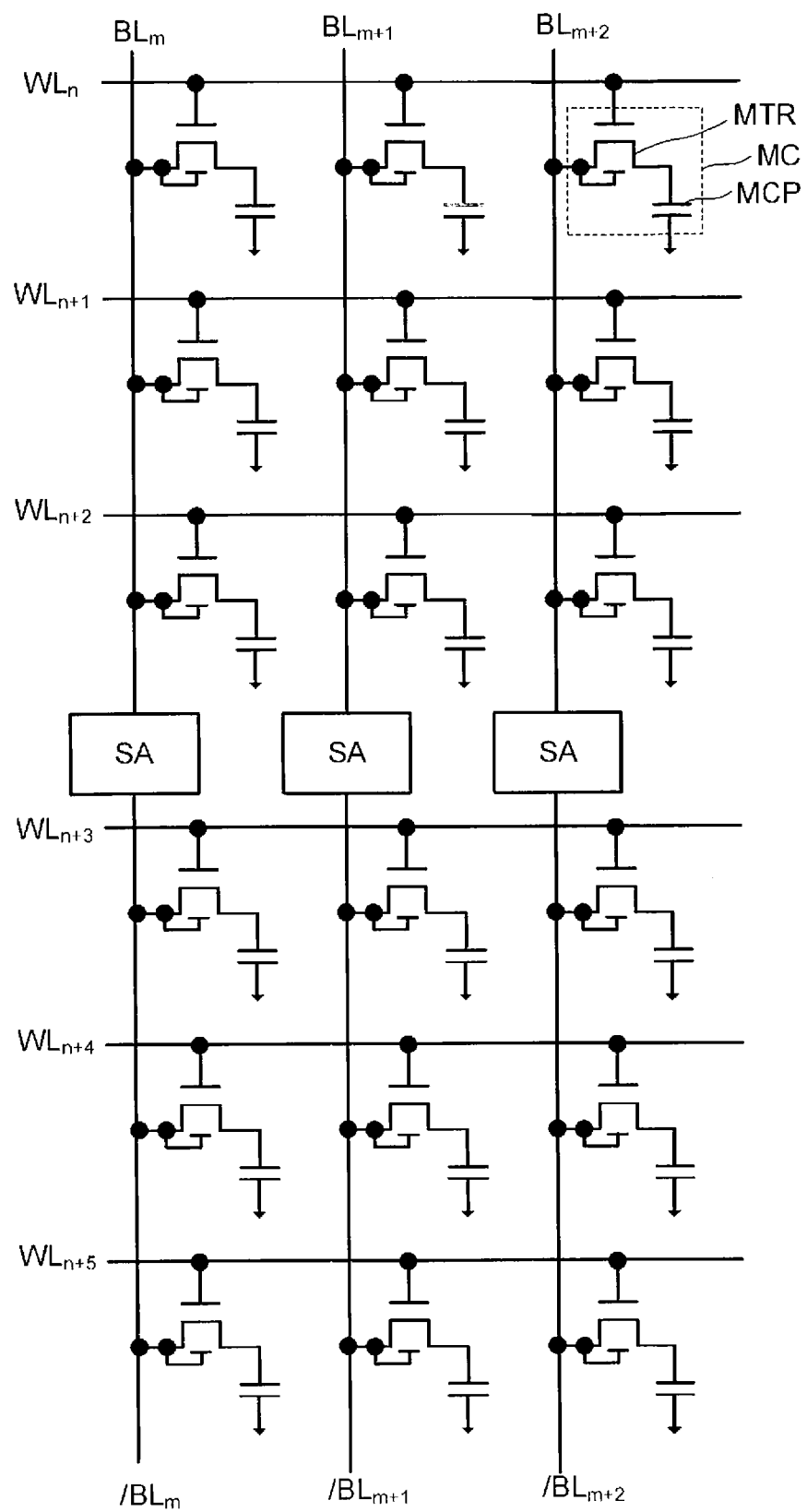
FIG. 3 is a schematic circuit diagram of memory cells and sense amplifiers according to a first modification.

FIG. 3 is a schematic circuit diagram of the memory cells MC and the sense amplifiers SA according to a first modification. FIG. 3 is an example of an open bit line method.

As illustrated in FIG. 3, in the open bit line method, a pair of corresponding bit lines BL and /BL (the bit lines $BL_m$, $/BL_m$, $BL_{m+1}$, $/BL_{m+1}$, $BL_{m+2}$ and $/BL_{m+2}$ where m is an integer) are respectively connected to the memory cells MC located on both sides of the sense amplifier SA (that is, the upper and lower sides in FIG. 3), and each pair of the bit lines BL and /BL is connected to one of the sense amplifiers SA. Each of the word lines WL intersects one of the bit lines BL and the bit lines /BL. The memory cells MC are formed at the intersections between the word lines WL and the bit lines BL and the intersections between the word lines WL and the bit lines /BL.

(Second Modification of Method of Connecting Memory Cell MC and Sense Amplifier SA)

Figure 4:
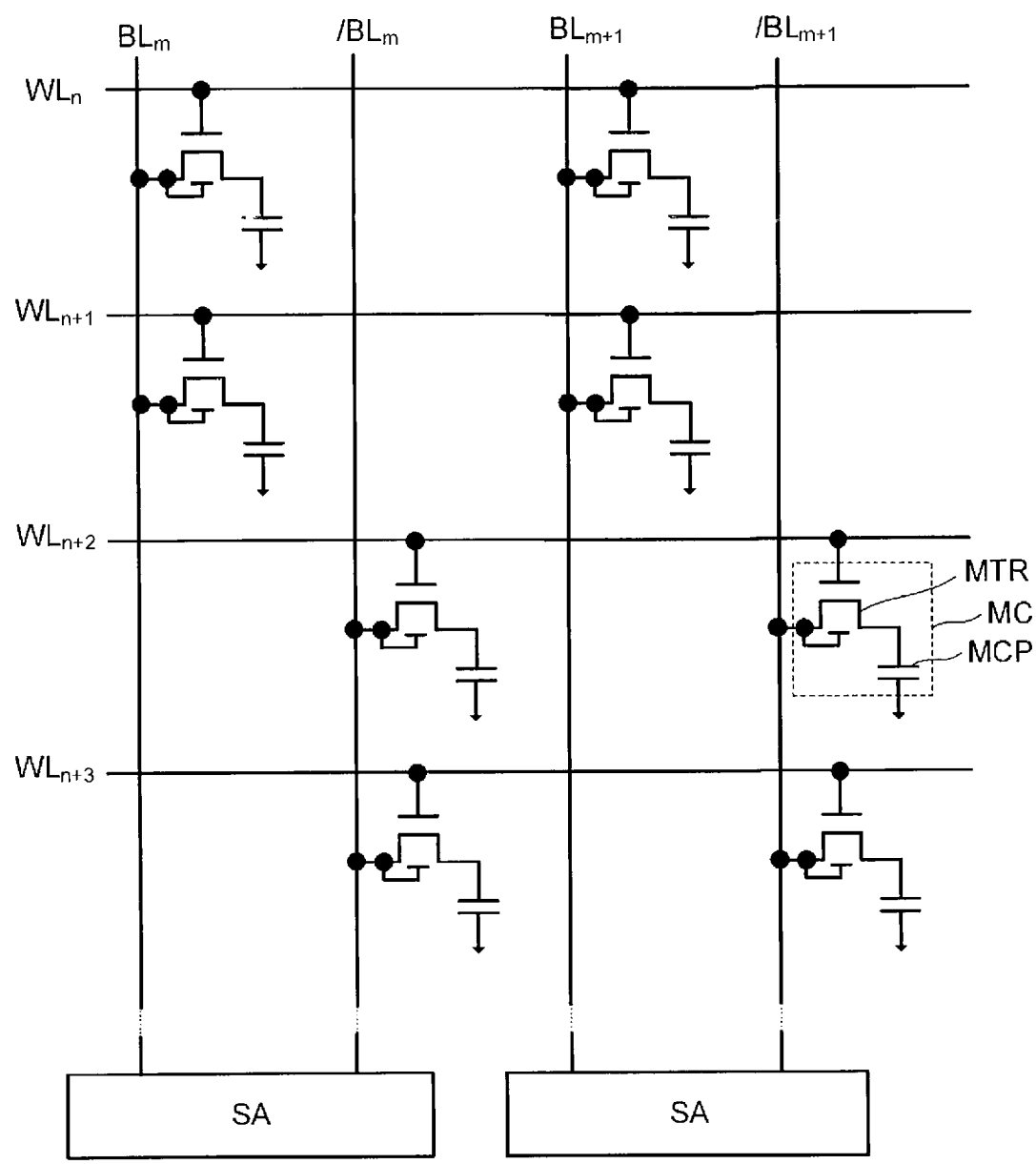
FIG. 4 is a schematic circuit diagram of memory cells and sense amplifiers according to a second modification.

FIG. 4 is a schematic circuit diagram of the memory cells MC and the sense amplifiers SA. FIG. 4 is an example of a folded bit line method.

As illustrated in FIG. 4, in the folded bit line method, a pair of the corresponding bit lines BL and /BL (the bit lines $BL_m$, $/BL_m$, $BL_{m+1}$, and $/BL_{m+1}$ where m is an integer) are connected to the different memory cells MC located on one side of the sense amplifier SA, and each pair of the bit lines BL and /BL is connected to one of the sense amplifiers SA. Each of the word lines WL intersects both of the bit lines BL and the bit lines /BL. The memory cells MC are formed at the intersections between one of the bit lines BL and /BL and each word line WL.

(Structural Example of Memory Transistor MTR)

Figure 5:
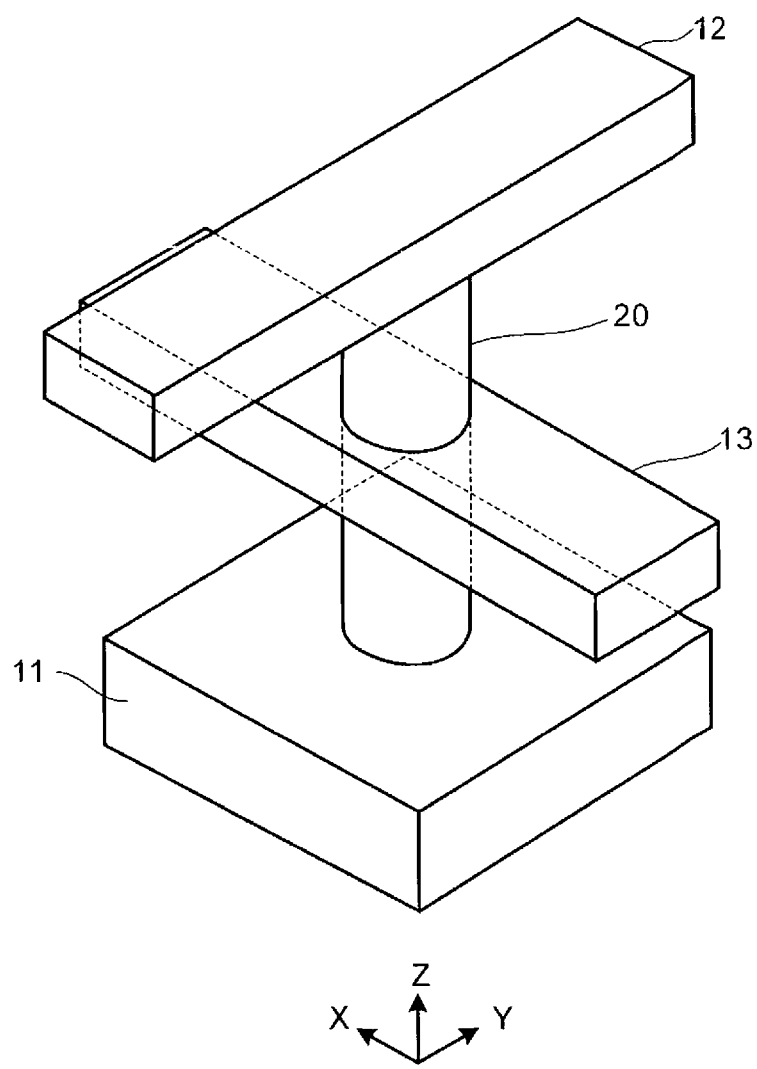
FIG. 5 is a schematic perspective view illustrating a structural example of a memory transistor.
Figure 6:
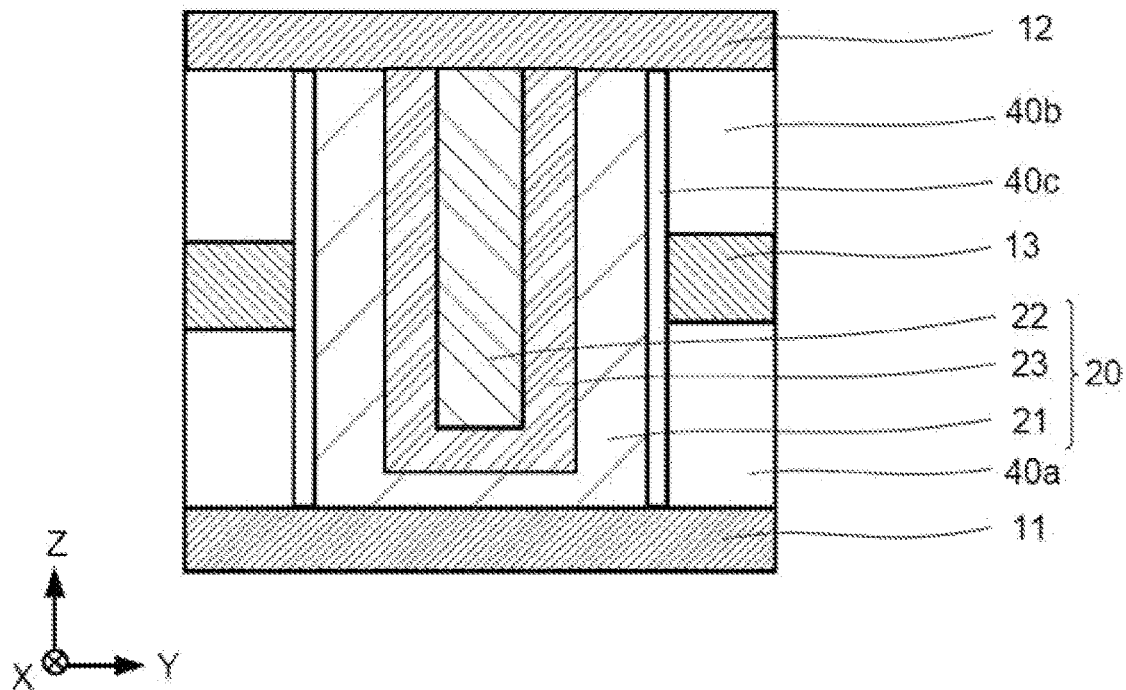
FIG. 6 is a schematic cross-sectional view illustrating a structural example of a memory transistor.

FIG. 5 is a schematic perspective view illustrating a structural example of the memory transistor MTR. FIG. 6 is a schematic cross-sectional view illustrating a structural example of the memory transistor MTR. FIGS. 5 and 6 illustrate a conductive layer 11, a conductive layer 12, a conductive layer 13, a columnar shaped body 20, an insulating layer 40a, an insulating layer 40b, and an insulating layer 40c. FIG. 6 illustrates a Y-Z cross section of the columnar shaped body 20. The X axis, Y axis, and Z axis intersect with each other.

The conductive layer 11 forms the source electrode or the drain electrode of the memory transistor MTR. The conductive layer 11 may form a cell electrode of the memory capacitor MCP.

The conductive layer 12 extends, for example, along a direction parallel to the Y axis (hereinafter simply referred to as the Y axis direction). The conductive layer 12 forms the source electrode or the drain electrode of the memory transistor MTR. In addition, the conductive layer 12 may form an electrode on the bit line BL side or the bit line /BL side.

The conductive layer 13 extends, for example, along a direction parallel to the X axis (hereinafter simply referred to as the X axis direction). The conductive layer 13 forms the gate electrode of the memory transistor MTR.

The conductive layer 11 and the conductive layer 12 include, for example, a conductive oxide, a conductive nitride, a metal, a metal compound, or a semiconductor. Examples of the conductive oxide include oxide including indium and tin (ITO), oxide including aluminum and zinc (AZO), oxide including indium and zinc (IZO), oxide including silicon and zinc (SZO), oxide including fluorine and zinc (FZO), oxide including fluorine and tin (FTO), oxide including antimony and tin (ATO), and oxide including phosphorus and tin (PTO). Examples of a conductive nitride material include titanium nitride (TiN), hafnium nitride (HfN), zirconium nitride (ZrN). Examples of the metal material include tungsten (W), titanium (Ti), copper (Cu), molybdenum (Mo), cobalt (Co), and ruthenium (Ru). Examples of the silicon material include amorphous silicon (a-Si).

The conductive layer 13 comprises, for example, a metal, a metal compound, or a semiconductor. The conductive layer 13 may comprise at least one material selected from the group consisting of tungsten (W) titanium (Ti), titanium nitride (TiN), molybdenum (Mo), copper (Cu), cobalt (Co), and ruthenium (Ru).

The columnar shaped body 20 extends from the conductive layer 12 to the conductive layer 11 and penetrates the conductive layer 13 along a direction parallel to the Z axis (hereinafter referred to as the Z axis direction). The columnar shaped body 20 includes a semiconductor layer 21, an electric conductor 22, and a charge storage film (also referred to as an "electronic trap film") 23.

The semiconductor layer 21 is connected to the conductive layer 11 provided on one side of the semiconductor layer 21 (below the semiconductor layer 21 in FIG. 6) and the conductive layer 12 provided on the other side of the semiconductor layer 21 (above the semiconductor layer 21 in FIG. 6).

The semiconductor layer 21 forms a channel of the memory transistor MTR. The semiconductor layer 21 extends along the Z axis direction. The semiconductor layer 21 is surrounded by the conductive layer 13 in the X-Y plane including the X axis direction and the Y axis direction. The semiconductor layer 21 extends between the conductive layers 11 and 12 along the Z axis direction. The semiconductor layer 21 includes an oxide semiconductor. The oxide semiconductor comprises at least one element selected from the group consisting of indium, gallium, zinc, and tin. Examples of oxide semiconductors include oxides of indium and gallium, indium and zinc, and indium and tin. The oxide semiconductor may be an oxide including indium, gallium, and zinc (indium-gallium-zinc-oxide), so-called IGZO (InGaZnO).

The electric conductor 22 forms a back gate electrode of the memory transistor MTR. The electric conductor 22 extends from the conductive layer 12 toward the conductive layer 11 along the Z axis direction. The electric conductor 22 is surrounded by the semiconductor layer 21 in the X-Y plane including the X axis direction and the Y axis direction. In the present specification, the electric conductor is not limited to a conductor, and may be a semiconductor containing an impurity element such as a donor or an acceptor.

The electric conductor 22 comprises, for example, a conductive oxide material, a conductive nitride material, a metal material, or a silicon material.

Examples of a conductive oxide material include indium-tin oxide (ITO), aluminum-zinc oxide (AZO), indium-zinc oxide (IZO), silicon-zinc oxide (SZO), fluorine-zinc oxide (FZO), fluorine-tin oxide (FTO), antimony-tin oxide (ATO), and phosphorus tin oxide (PTO). Examples of a conductive nitride material include titanium nitride (TiN), hafnium nitride (HfN), and zirconium nitride (ZrN). Examples of a metal material include tungsten (W), copper (Cu), and molybdenum (Mo). Examples of a silicon material include amorphous silicon (a-Si).

The electric conductor 22 may taper toward the conductive layer 11 along the Z axis direction. In such a case, the electric field may be concentrated at the lower end of the electric conductor 22.

The charge storage film 23 is provided between the semiconductor layer 21 and the electric conductor 22 in the X-Y plane including the X axis direction and the Y axis direction. The charge storage film 23 extends between the conductive layer 11 and the electric conductor 22 along the Z axis direction. The charge storage film 23 comprises, for example, aluminum oxide (AlO), aluminum nitride (AlN), silicon nitride (SiN), or hafnium oxide (HfO).

The insulating layer 40a is provided between the conductive layer 11 and the conductive layer 13 in the Z axis direction.

The insulating layer 40b is provided between the conductive layer 13 and the conductive layer 12 in the Z axis direction.

The insulating layer 40c is provided between the conductive layer 13 and the semiconductor layer 21 in the X-Y plane including the X axis direction and the Y axis direction. The insulating layer 40c forms a gate insulating film of the memory transistor MTR.

The insulating layer 40a, the insulating layer 40b, and the insulating layer 40c comprise, for example, silicon oxide.

The memory transistor MTR is a Surrounding Gate Transistor (SGT) in which gate electrodes surround the channel layer. The region of the semiconductor storage device can be reduced by the SGT.

A field effect transistor having a channel layer including an oxide semiconductor such as IGZO has a lower off leakage current than a field effect transistor provided on a semiconductor substrate. Therefore, for example, data stored in the memory cell MC can be stored for a long time, and thus the number of times of refresh operations can be reduced. The field effect transistor including a channel layer including an oxide semiconductor can be formed by a low temperature process, it is possible to prevent applying thermal stress to the memory capacitor MCP.

In the field effect transistor, electron carriers are generated due to oxygen deficiency in the channel layer, and the off leakage current may increase. This causes operation malfunction of the semiconductor storage device 1.

However, in the semiconductor storage device 1, by an operation (trap operation) of trapping the electron carriers generated due to the oxygen deficiency of the channel layer in the charge storage film 23, the operation malfunction of the semiconductor storage device can be decreased.

(First Modification of Memory Transistor MTR)

Figure 7:
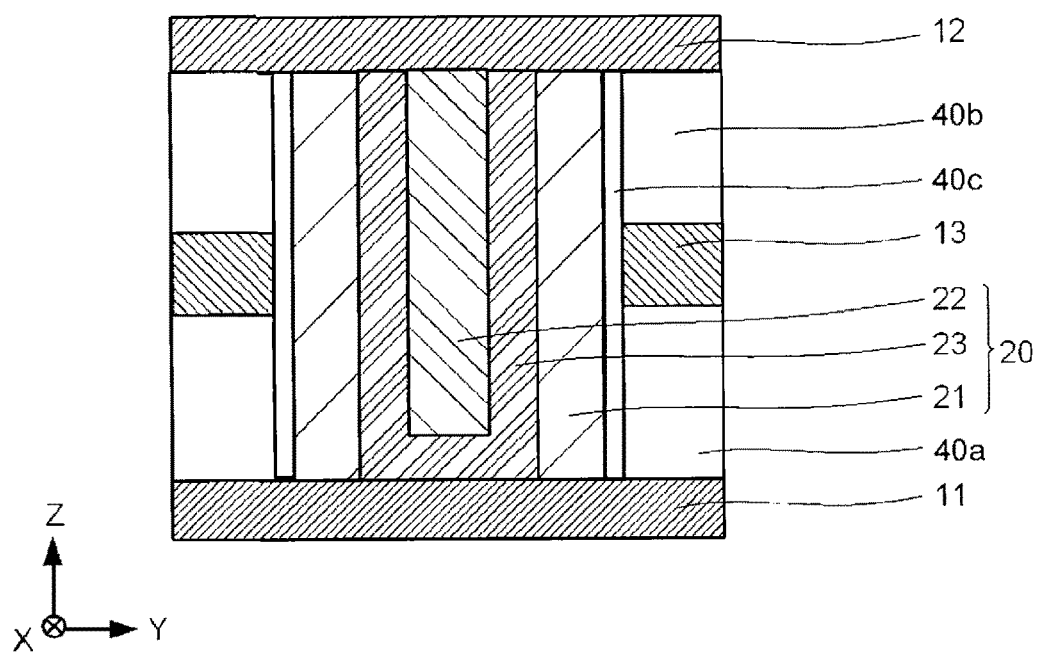
FIG. 7 is a schematic cross-sectional view illustrating a memory transistor according to a first modification.

FIG. 7 is a schematic cross-sectional view illustrating a memory transistor MTR according to a first modification. FIG. 7 illustrates a Y-Z cross section of the columnar shaped body 20.

In comparison with the columnar shaped body 20 illustrated in FIG. 6, the columnar shaped body 20 illustrated in FIG. 7 is different in that the charge storage film 23 in the Z axis direction extends from the conductive layer 12 to the conductive layer 11. For other parts, the description in FIG. 6 may be used as appropriate.

An end of the charge storage film 23 in the Z axis direction is in contact with the conductive layer 11.

The charge storage film 23 has a p-type conductivity type. Accordingly, the contact resistance between the conductive layer 11 and the charge storage film 23 can be increased.

(Second Modification of Memory Transistor MTR)

Figure 8:
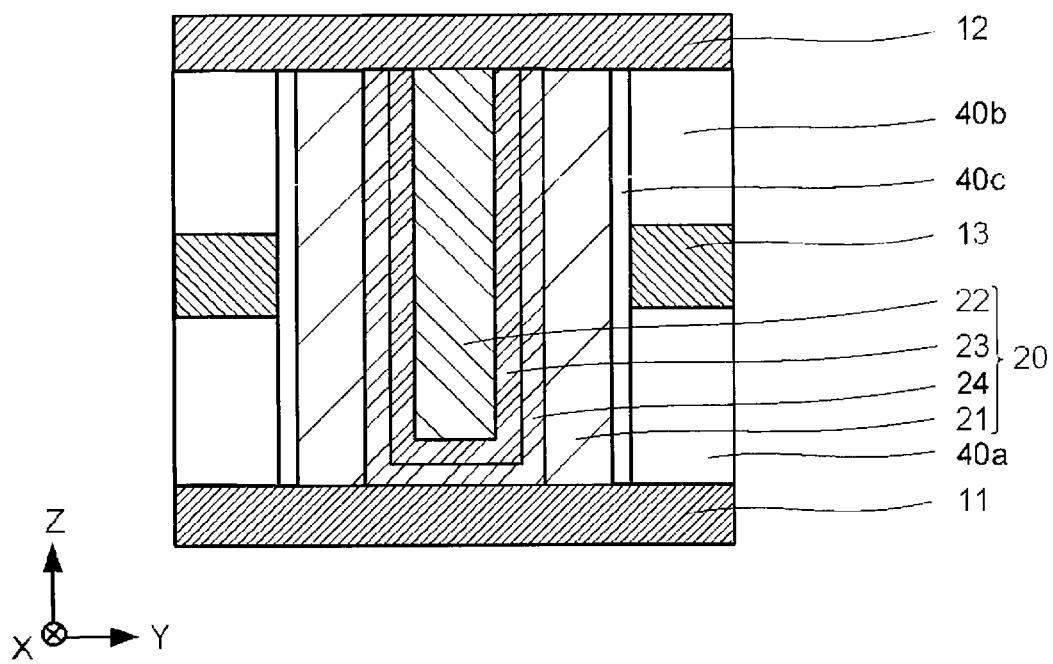
FIG. 8 is a schematic cross-sectional view illustrating a memory transistor according to a second modification.

FIG. 8 is a schematic cross-sectional view illustrating a memory transistor MTR according to a second modification. FIG. 8 illustrates the Y-Z cross section of the columnar shaped body 20.

In comparison with the columnar shaped body 20 illustrated in FIG. 6, the columnar shaped body 20 illustrated in FIG. 8 is different in that a tunnel insulating film 24 is provided as an insulating layer between the semiconductor layer 21 and the charge storage film 23 in the X-Y plane including the X axis direction and the Y axis direction. For the other portions, the descriptions for FIG. 6 can apply.

The tunnel insulating film 24 comprises, for example, silicon oxide or aluminum oxide.

The tunnel insulating film 24 prevents the electric connection between the conductive layer 11 and the conductive layer 12 via the electric conductor 22. When electric charges are trapped in the charge storage film 23, detrapping to the electric conductor 22 can be prevented by forming the tunnel insulating film 24.

In the second modification, the semiconductor layer 21 may extend between the tunnel insulating film 24 and the conductive layer 11 along the Z axis direction.

(Third Modification of Memory Transistor MTR)

Figure 9:
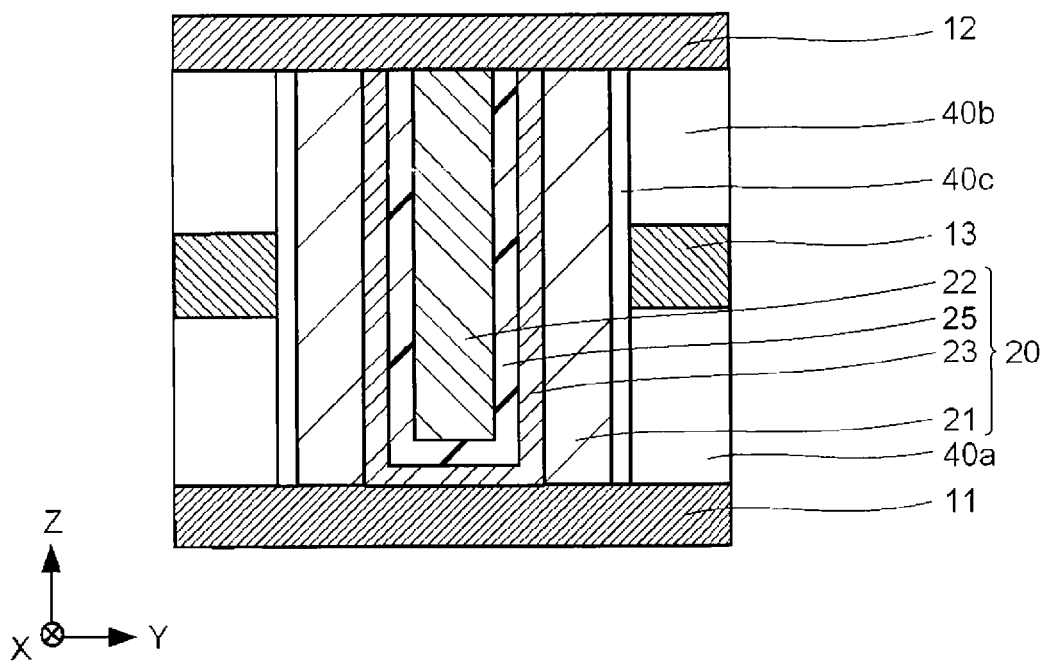
FIG. 9 is a schematic cross-sectional view illustrating a memory transistor according to a third modification.

FIG. 9 is a schematic cross-sectional view illustrating a memory transistor MTR according to a third modification. FIG. 9 illustrates the Y-Z cross section of the columnar shaped body 20.

In comparison with the columnar shaped body 20 illustrated in FIG. 6, the columnar shaped body 20 illustrated in FIG. 9 is different in that a block insulating film 25 is provided as an insulating layer between the electric conductor 22 and the charge storage film 23 in the X-Y plane including the X axis direction and the Y axis direction. For the other portions, the descriptions for FIG. 6 can apply.

The block insulating film 25 comprises, for example, silicon oxide or aluminum oxide.

The block insulating film 25 prevents the electric connection with the electric conductor 22 and the charge storage film 23. When electric charges are trapped in the charge storage film 23, detrapping to the electric conductor 22 can be prevented by forming the block insulating film 25.

In the third modification, the charge storage film 23 may not include a portion that faces the electric conductor 22 in the Z axis direction (a portion between the electric conductor 22 and the conductive layer 11 in the Z axis direction of FIG. 9). In such a case, the block insulating film 25 may be in contact with the conductive layer 11. The electric conductor 22 and the conductive layer 11 are insulated from each other by the block insulating film 25.

The semiconductor layer 21 may extend between the electric conductor 22 and the conductive layer 11 in the Z axis direction. The charge storage film 23 may not include a portion that faces the electric conductor 22 in the Z axis direction. In such a case, the block insulating film 25 may be in contact with the semiconductor layer 21. The electric conductor 22 and the semiconductor layer 21 are insulated from each other by the block insulating film 25.

(Fourth Modification of Memory Transistor MTR)

Figure 10:
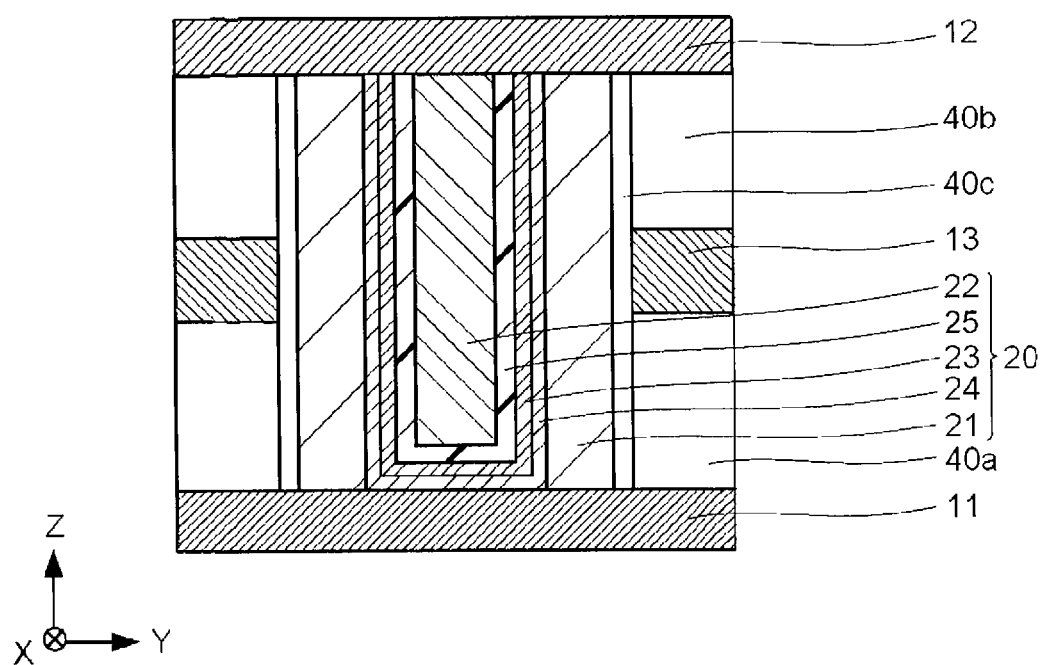
FIG. 10 is a schematic cross-sectional view illustrating a memory transistor according to a fourth modification.

FIG. 10 is a schematic cross-sectional view illustrating a fourth modification of the memory transistor MTR. FIG. 10 is the Y-Z cross section of the columnar shaped body 20.

In comparison with the columnar shaped body 20 illustrated in FIG. 6, the columnar shaped body 20 illustrated in FIG. 10 is different in that, in the X-Y plane including the X axis direction and the Y axis direction, the tunnel insulating film 24 is provided between the semiconductor layer 21 and the charge storage film 23, and the block insulating film 25 is provided between the electric conductor 22 and the charge storage film 23. For the other portions, the description in FIG. 6 may be used as appropriate. In addition, as the description of the tunnel insulating film 24 and the block insulating film 25, the descriptions of the second modification and the third modification of the memory transistor MTR may be used as appropriate.

In the fourth modification, the charge storage film 23 may not include a portion that faces the electric conductor 22 in the Z axis direction (a portion between the electric conductor 22 and the conductive layer 11 in the Z axis direction of FIG. 10). In this case, the block insulating film 25 may be in contact with the tunnel insulating film 24, and may be in contact with the conductive layer 11 when the tunnel insulating film 24 is removed. The electric conductor 22 and the conductive layer 11 are insulated from each other by the block insulating film 25.

The semiconductor layer 21 may extend between the electric conductor 22 and the conductive layer 11 in the Z axis direction. The charge storage film 23 may not include a portion that faces the electric conductor 22 in the Z axis direction. In this case, the block insulating film 25 may be in contact with the tunnel insulating film 24 and may be in contact with the semiconductor layer 21 when the tunnel insulating film 24 is removed. In this case, the electric conductor 22 and the semiconductor layer 21 are insulated from each other by the block insulating film 25.

(Operation Example of Semiconductor Storage Device)

An operation example including the trap operation of the semiconductor storage device is described below. The trap operation is preferably performed during at least one of a write operation, a read operation, or a refresh operation. An example of performing the trap operation in each of these operation types is described below.

First Example of Write Operation

Figure 11:
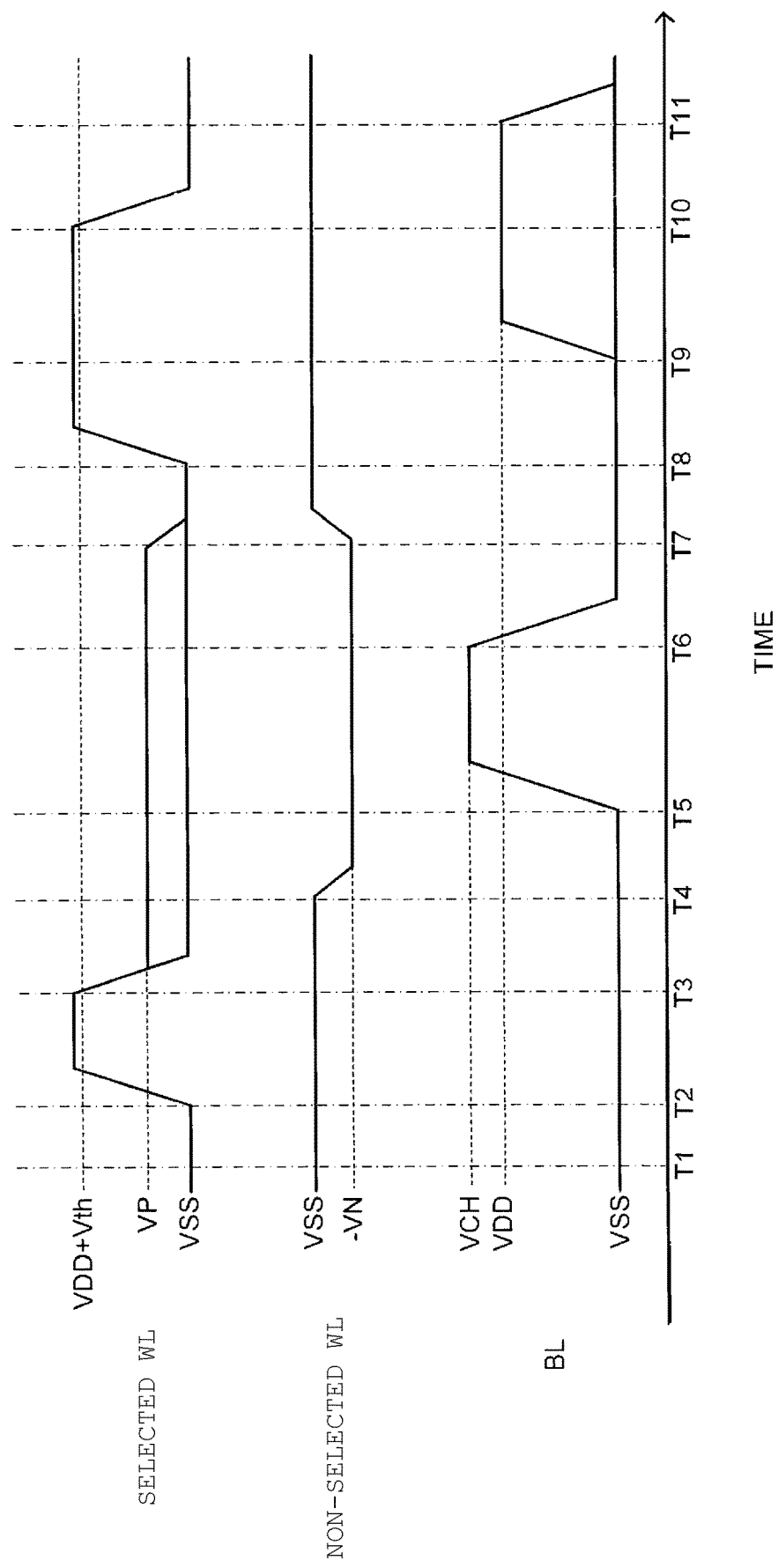
FIG. 11 is a timing chart of a write operation performed by a semiconductor storage device according to a first example.

FIG. 11 is a timing chart of a write operation performed by the semiconductor storage device 1. First, the word line WL and the bit line BL corresponding to the memory cell MC to which data is written are selected.

In time T1, a voltage VSS is applied to each of the word line WL and the bit line BL. VSS is lower than a ground voltage, for example, 0 V, and VSS may be a negative voltage.

Subsequently, after time T2, a voltage larger than VDD+Vth is applied to the selected word line WL. In addition, the voltage VSS applied to each of the non-selected word line WL and the bit line BL is maintained. VDD is higher than the ground voltage and is, for example, a positive voltage. Vth is a threshold voltage of the memory transistor MTR.

Accordingly, in the memory cell MC connected to the selected word line WL, the memory transistor MTR becomes the on state. When the electric charges are stored in the memory capacitor MCP, the electric charges from the memory capacitor MCP are emitted to the bit line BL.

Subsequently, after time T3, the voltage VSS or a voltage VP is applied to the selected word line WL. In addition, the voltage VSS applied to each of the non-selected word line WL and the bit line BL is maintained. The voltage VP is a positive voltage higher than the voltage VSS. The level of the voltage VP is set according to the material or the structure of the memory transistor MTR.

Subsequently, after time T4, a voltage –VN is applied to the non-selected word line WL. –VN is a negative voltage lower than the voltage VSS. In addition, the voltage VP or VSS applied to the selected word line WL is maintained. The voltage VSS applied to the bit line BL is also maintained.

By applying the voltage –VN to the non-selected word line WL, the memory transistor MTR of a non-selected memory cell MC can be prevented from becoming the on state, and thus erroneous writing can be prevented.

Subsequently, after time T5, a voltage VCH is applied to the bit line BL. In addition, the voltage VP or VSS applied to the selected word line WL is maintained. The voltage –VN applied to the non-selected word line WL is also maintained. The voltage VCH is higher than the voltage VDD. The level of the voltage VCH is set according to a voltage required for the trap operation.

Figure 12:
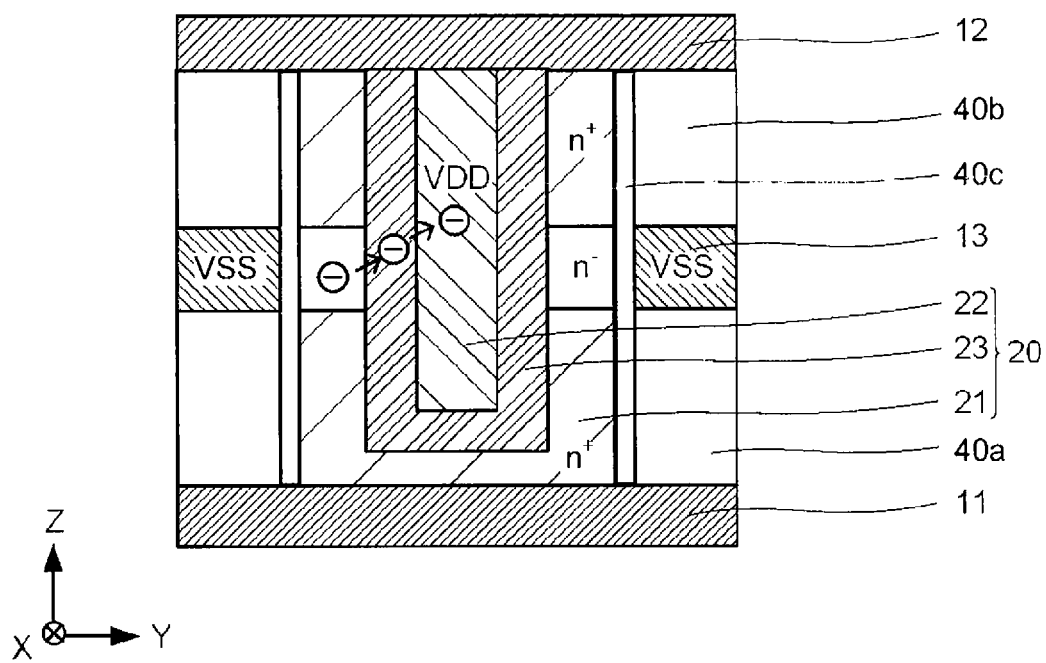
FIG. 12 is a schematic cross-sectional view illustrating a state of a memory transistor after a period of time.

FIG. 12 is a schematic cross-sectional view illustrating a state of the memory transistor MTR after the time T5. FIG. 12 is the Y-Z cross section of the memory transistor MTR. By applying the voltage VCH to the bit line BL, in the memory cell MC connected to the selected word line WL, a negative voltage is applied to the gate of the memory transistor MTR (the conductive layer 13) and the back gate (the electric conductor 22). Accordingly, in an overlapping portion of the semiconductor layer 21 with the conductive layer 13 (channel region), electron carriers generated due to the oxygen deficiency in the semiconductor layer 21 move to and are trapped in the charge storage film 23. The overlapping portion of the semiconductor layer 21 with the conductive layer 13 has a lower electron carrier density than the other region of the semiconductor layer 21.

Subsequently, after time T6, the voltage VSS is applied to the bit line BL. In addition, the voltage VP or VSS applied to the selected word line WL is maintained. The voltage –VN applied to the non-selected word line WL is also maintained.

Subsequently, after time T7, the voltage VSS is applied to the selected word line WL and the non-selected word line WL. In addition, the voltage VSS applied to the bit line BL is maintained.

Subsequently, after time T8, the voltage larger than the voltage VDD+Vth is applied to the selected word line WL.

In addition, the voltage VSS applied to each of the non-selected word line WL and the bit line BL is maintained.

Accordingly, in the memory cell MC connected to the selected word line WL, the memory transistor MTR becomes the on state.

Subsequently, after time T9, the voltage VSS or VDD is applied to the bit line BL. When data of "0" is written, the voltage VSS is applied to the bit line BL. When data of "1" is written, the voltage VDD is applied to the bit line BL. In addition, the voltage higher than the voltage VDD+Vth is applied to the selected word line WL. The voltage VSS applied to the non-selected word line WL is maintained.

Accordingly, in the memory cell MC connected to the selected word line WL, while the memory transistor MTR is maintained in the on state, the voltage VDD or VSS applied to the bit line BL is applied to one electrode of the memory capacitor MCP.

Subsequently, after a time T10, the voltage VSS is applied to the selected word line WL. In addition, the voltage VSS applied to the non-selected word line WL is maintained. The voltage VDD or VSS applied to the bit line BL is maintained.

Accordingly, in the memory cell MC connected to the selected word line WL, the memory transistor MTR becomes the off state, and data of the memory capacitor MCP is stored.

Subsequently, after time T11, the voltage VSS is applied to the bit line BL and the selected word line WL. The voltage VSS applied to the non-selected word line WL is maintained.

Second Example of Write Operation

Figure 13:
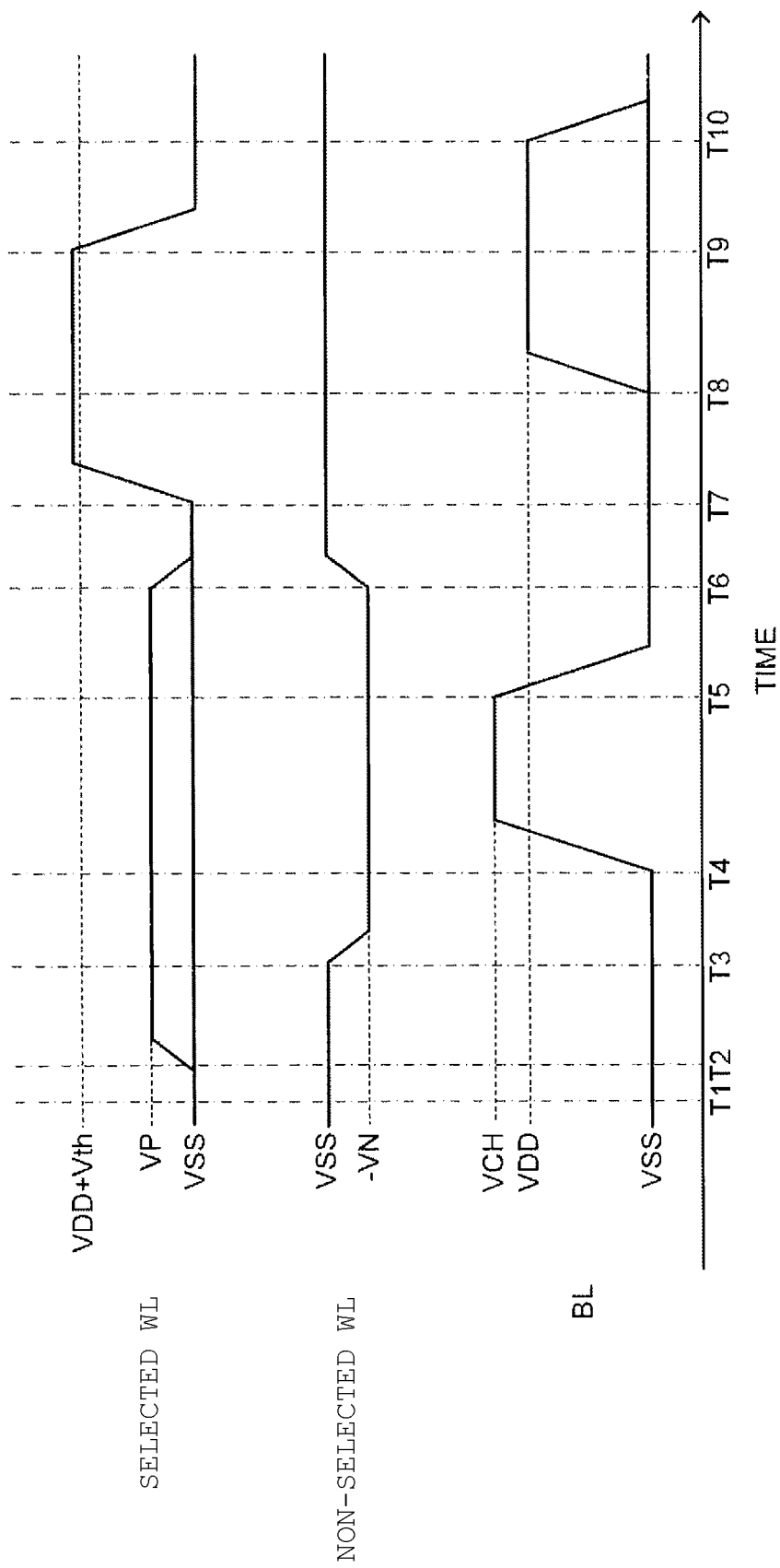
FIG. 13 is a timing chart of a write operation performed by a semiconductor storage device according to a second example.

FIG. 13 is a timing chart illustrating a write operation performed by the semiconductor storage device 1 according to a second example. First, the word line WL and the bit line BL corresponding to the memory cell MC to which data is written are selected. Hereinafter, the same descriptions as the first example may not be repeated.

In the time T1, the voltage VSS is applied to each of the word lines WL and the bit line BL.

Subsequently, after the time T2, the voltage VSS or VP is applied to the selected word line WL. The voltage VSS applied to each of the non-selected word line WL and the bit line BL is maintained.

Subsequently, after the time T3, the voltage −VN is applied to the non-selected word line WL. The voltage VP or VSS applied to the selected word line WL is maintained. The voltage VSS applied to the bit line BL is maintained.

By applying the voltage −VN to the non-selected word line WL, the memory transistor MTR of the non-selected memory cell MC can be prevented from becoming the on state, and thus erroneous writing can be prevented.

Subsequently, after the time T4, the voltage VCH is applied to the bit line BL. The voltage VP or VSS applied to the selected word line WL is maintained. The voltage −VN applied to the non-selected word line WL is maintained.

By applying the voltage VCH to the bit line BL, in the memory cell MC connected to the selected word line WL, a negative voltage is applied to the gate (the conductive layer 13) and the back gate (the electric conductor 22) of the memory transistor MTR. Accordingly, in the overlapping portion of the semiconductor layer 21 with the conductive layer 13 (channel region), electron carriers generated due to the oxygen deficiency in the semiconductor layer 21 move to and are trapped in the charge storage film 23. The overlapping portion of the semiconductor layer 21 with the conductive layer 13 has a lower electron carrier density than the other region of the semiconductor layer 21.

Subsequently, after the time T5, the voltage VSS is applied to the bit line BL. In addition, the voltage VP or VSS applied to the selected word line WL is maintained. The voltage −VN applied to the non-selected word line WL is maintained.

Subsequently, after the time T6, the voltage VSS is applied to the selected word line WL and the non-selected word line WL. The voltage VSS applied to the bit line BL is maintained.

Subsequently, after the time T7, a voltage higher than the voltage VDD+Vth is applied to the selected word line WL. The voltage VSS applied to each of the non-selected word line WL and the bit line BL is maintained.

Accordingly, in the memory cell MC connected to the selected word line WL, the memory transistor MTR becomes the on state. When electric charges are stored in the memory capacitor MCP, the electric charges are emitted from the memory capacitor MCP to the bit line BL.

Subsequently, after the time T8, the voltage VSS or VDD is applied to the bit line BL. When data of "0" is written, the voltage VSS is applied to the bit line BL. When data of "1" is written, the voltage VDD is applied to the bit line BL. In addition, the voltage higher than the voltage VDD+Vth and applied to the selected word line WL is maintained. The voltage VSS applied to the non-selected word line WL is maintained.

Accordingly, in the memory cell MC connected to the selected word line WL, while the memory transistor MTR is maintained in the on state, the voltage VDD or VSS applied to the bit line BL is applied to one electrode of the memory capacitor MCP.

Subsequently, after the time T9, the voltage VSS is applied to the selected word line WL. The voltage VSS applied to the non-selected word line WL is maintained. The voltage VDD or VSS applied to the bit line BL is maintained.

Accordingly, in the memory cell MC connected to the selected word line WL, the memory transistor MTR becomes the off state, and data of the memory capacitor MCP is stored.

Subsequently, after the time T10, the voltage VSS is applied to the bit line BL. In addition, the voltage VSS applied to the selected word line WL is maintained. The voltage VSS applied to the non-selected word line WL is maintained.

Third Example of Write Operation

Figure 14:
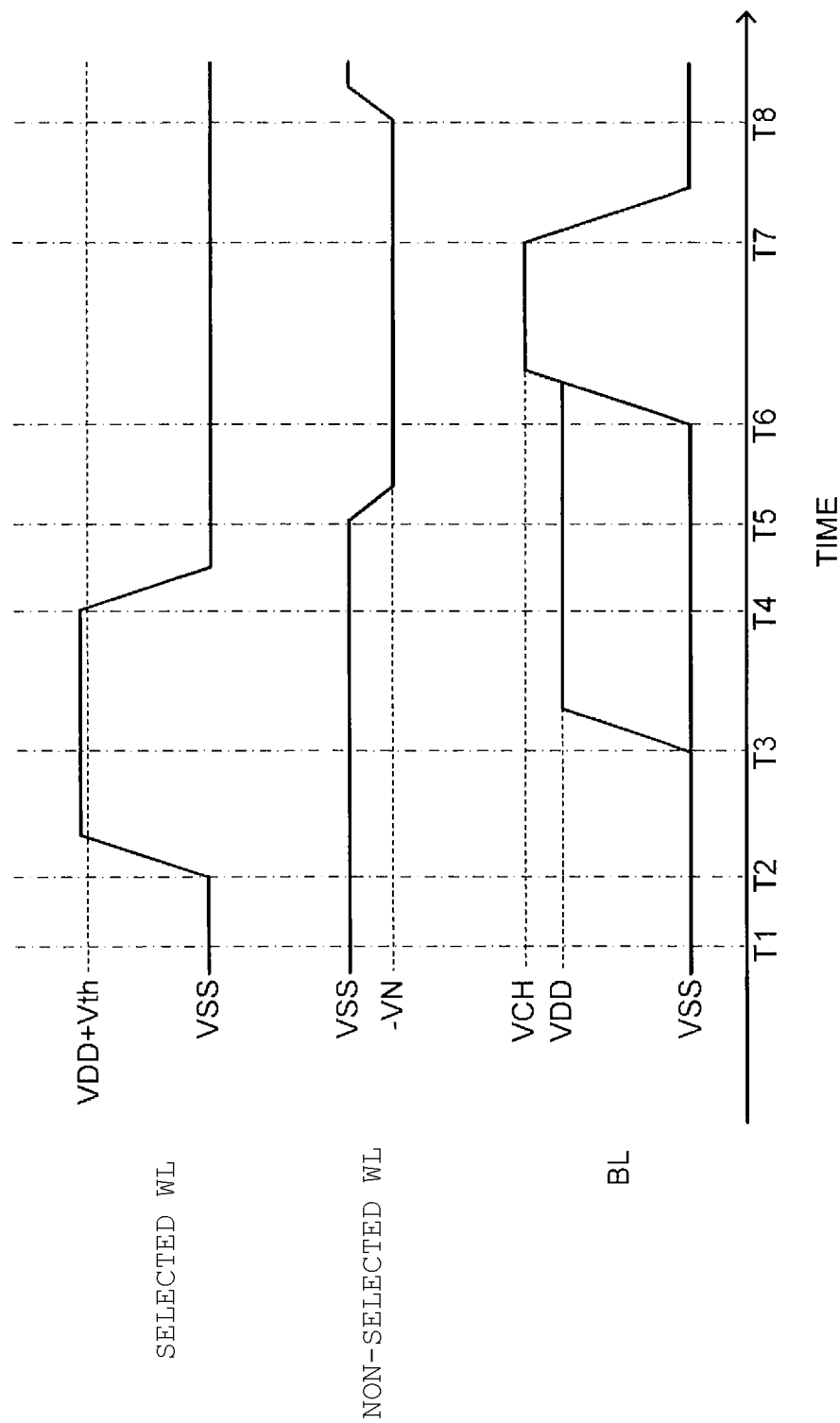
FIG. 14 is a timing chart of a write operation performed by a semiconductor storage device according to a third example.

FIG. 14 is a timing chart illustrating a write operation performed by the semiconductor storage device 1 according to a third example. First, the word line WL and the bit line BL corresponding to the memory cell MC to which data is written are selected. The same descriptions as the first example may not be repeated.

In the time T1, the voltage VSS is applied to each of the word lines WL and the bit line BL.

Subsequently, after the time T2, a voltage higher than the voltage VDD+Vth is applied to the selected word line WL. The voltage VSS applied to each of the non-selected word line WL and the bit line BL is maintained.

Accordingly, in the memory cell MC connected to the selected word line WL, the memory transistor MTR becomes the on state.

Subsequently, after the time T3, the voltage VSS or VDD is applied to the bit line BL. When data of "0" is written, the voltage VSS is applied to the bit line BL. When data of "1" is written, the voltage VDD is applied to the bit line BL. In addition, the voltage higher than the voltage VDD+Vth and applied to the selected word line WL is maintained. The voltage VSS applied to the non-selected word line WL is also maintained.

Accordingly, in the memory cell MC connected to the selected word line WL, while the memory transistor MTR is maintained in the on state, the voltage VDD or VSS applied to the bit line BL is applied to one electrode of the memory capacitor MCP.

Subsequently, after the time T4, the voltage VSS is applied to the selected word line WL. The voltage VSS applied to the non-selected word line WL is maintained. The voltage VDD or VSS applied to the bit line BL is maintained.

Accordingly, in the memory cell MC connected to the selected word line WL, the memory transistor MTR becomes the off state, and data of the memory capacitor MCP is stored.

Subsequently, after the time T5, the voltage −VN is applied to the non-selected word line WL. The voltage VSS applied to each of the selected word line WL and the bit line BL is maintained.

By applying the voltage −VN to the non-selected word line WL, the memory transistor MTR of the non-selected memory cell MC can be prevented from becoming the on state, and thus erroneous writing can be prevented.

Subsequently, after the time T6, the voltage VCH is applied to the bit line BL. In addition, the voltage VSS applied to the selected word line WL is maintained. The voltage −VN applied to the non-selected word line WL is maintained.

By applying the voltage VCH to the bit line BL, in the memory cell MC connected to the selected word line WL, a negative voltage is applied to the gate (the conductive layer 13) and the back gate (the electric conductor 22) of the memory transistor MTR. Accordingly, in the overlapping portion of the semiconductor layer 21 with the conductive layer 13 (channel region), electron carriers generated due to the oxygen deficiency in the semiconductor layer 21 move to and are trapped in the charge storage film 23. The overlapping portion of the semiconductor layer 21 with the conductive layer 13 has a lower electron carrier density than the other region of the semiconductor layer 21.

Subsequently, after the time T7, the voltage VSS is applied to the bit line BL. In addition, the voltage VSS applied to the selected word line WL is maintained. The voltage −VN applied to the non-selected word line WL is maintained.

Subsequently, after the time T8, the voltage VSS is applied to the non-selected word line WL. In addition, the voltage VSS applied to each of the selected word line WL and the bit line BL is maintained.

[Read Operation]

Figure 15:
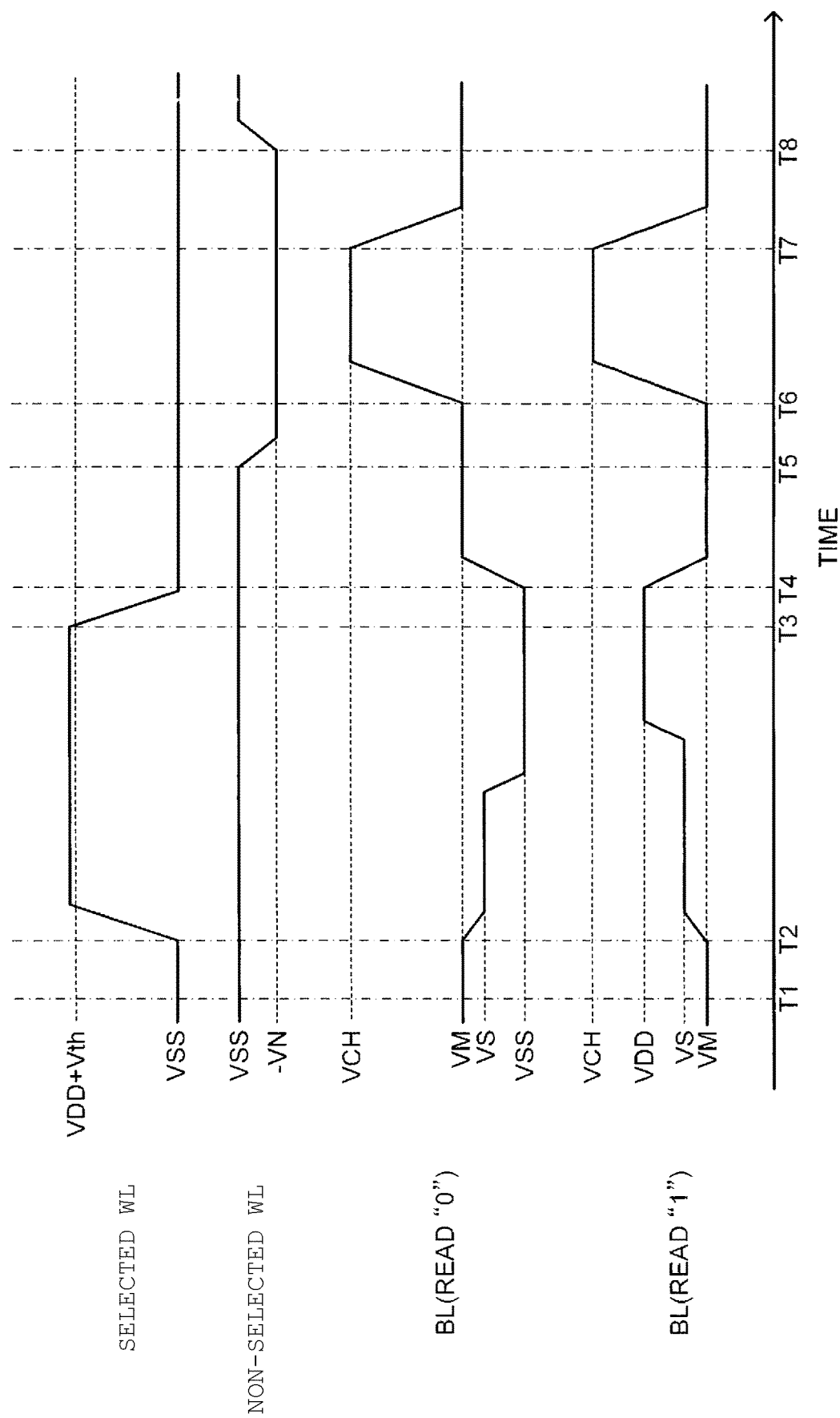
FIG. 15 is a timing chart of a read operation performed by a semiconductor storage device.

FIG. 15 is a timing chart illustrating a read operation performed by the semiconductor storage device 1. In FIG. 15, the changes in the voltages applied to the bit line BL are separately illustrated for the case of reading data of "0" and the case of reading data of "1". The refresh operation is also the same as the read operation.

At the time T1, a voltage VM is applied to the bit line BL and the sense amplifier SA. The voltage VM is, for example, a half of the voltage VDD (VDD/2). In addition, the voltage VSS is applied to each of the word lines WL.

Subsequently, the word line WL and the bit line BL corresponding to the memory cell MC from which data is read are selected. After the time T2, a voltage higher than the voltage VDD+Vth is applied to the selected word line WL. The voltage VSS applied to the non-selected word line WL is maintained. The voltage VM applied to the bit line BL is also maintained.

Accordingly, in the memory cell MC connected to the selected word line WL, the memory transistor MTR becomes the on state, the voltage that changes according to the electric charges stored in the memory capacitor MCP is input to the sense amplifier SA via each of the bit lines BL. The voltage applied to the bit line BL is changed to the voltage VS and then is changed to the voltage VDD or VSS by the sense amplifier SA. When the data of "0" is read, the voltage VS is lower than the voltage VM. When the data of "1" is read, the voltage VS is higher than the voltage VM. In the same manner as in the folded bit line method, when the bit line /BL is used, the voltage applied to the bit line /BL is an opposite voltage to the voltage applied to the bit line BL. For example, when the voltage VDD is applied to the bit line BL, the voltage VSS is applied to the bit line /BL.

Subsequently, after the time T3, the voltage VSS is applied to the selected word line WL. The voltage VSS applied to the non-selected word line WL is maintained. The voltage VDD or VSS applied to the bit line BL is maintained.

Accordingly, in the memory cell MC connected to the selected word line WL, the memory transistor MTR becomes the off state.

Subsequently, after the time T4, the voltage VM is applied to the bit line BL and the sense amplifier SA. In addition, the voltage VSS applied to the selected word line WL is maintained. The voltage VSS applied to the non-selected word line WL is maintained.

Subsequently, after the time T5, the voltage −VN is applied to the non-selected word line WL. In addition, the voltage VSS applied to the selected word line WL is maintained. The voltage VM applied to the bit line BL is also maintained.

By applying the voltage −VN to the non-selected word line WL, the memory transistor MTR of the non-selected memory cell MC can be prevented from becoming the on state, and thus erroneous writing can be prevented.

Subsequently, after the time T6, the voltage VCH is applied to the bit line BL. In addition, the voltage VSS applied to the selected word line WL is maintained. The voltage −VN applied to the non-selected word line WL is maintained.

Accordingly, in the memory cell MC connected to the selected word line WL, a negative voltage is applied between the gate (the conductive layer 13) and the back gate (the electric conductor 22) of the memory transistor MTR. Accordingly, electron carriers generated due to the oxygen deficiency in the semiconductor layer 21 move to and are trapped in the charge storage film 23.

Subsequently, after the time T7, the voltage VM is applied to the bit line BL. In addition, the voltage VSS applied to the selected word line WL is maintained. The voltage −VN applied to the non-selected word line WL is maintained.

Subsequently, after the time T8, the voltage VSS is applied to the non-selected word line WL. In addition, the voltage VSS applied to the selected word line WL is maintained. The voltage VM applied to the bit line BL is maintained.

As described above, in the semiconductor storage device 1 according to the embodiments, the memory transistor MTR is an SGT, and includes an oxide semiconductor layer, a charge storage film, and an electric conductor extending from a source electrode or a drain electrode in the Z axis direction. Accordingly, the voltage applied to the bit line BL can be applied to the back gate. In addition, a positive voltage is applied to the electric conductor 22 and the conductive layer 12 so that the electric charges can be injected to the charge storage film 23 by using the channel hot carrier injection. Accordingly, in case of the write operation or the read and refresh operation, a negative voltage is applied between the gate and the back gate of the memory transistor MTR so that electron carriers generated due to the oxygen deficiency in the channel layer can be trapped in the charge storage film. Accordingly, due to the decrease in the electron carrier density in the channel region and the potential of the trap electrons, the off leakage current of the memory transistor MTR is decreased, so that the operation malfunction of the semiconductor storage device can be prevented.

(Production Method Example of Semiconductor Storage Device)

Subsequently, in manufacturing the semiconductor storage device 1, an example of a method of forming the memory transistor MTR is described with reference to FIGS. 16 to 23. FIGS. 16 to 23 are schematic cross-sectional views illustrating an example of the production method of the memory transistor MTR. FIGS. 16 to 23 illustrate the Y-Z cross section of the memory transistor MTR.

Figure 16:
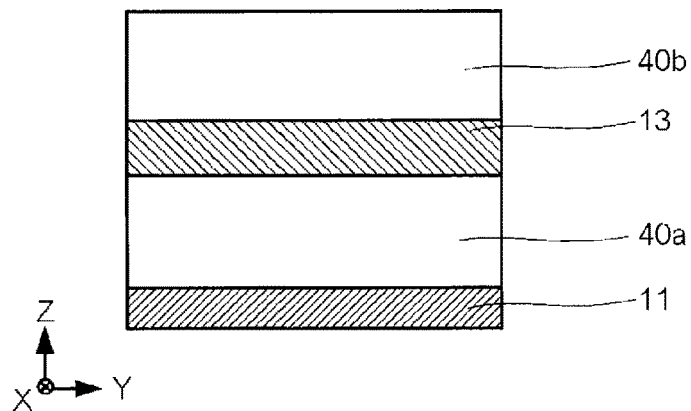
FIGS. 16-23 depict a production method of a memory transistor.

First, as illustrated in FIG. 16, the conductive layer 11, the insulating layer 40a, the conductive layer 13, and the insulating layer 40b are sequentially formed. Each layer can be formed by using sputtering or a chemical vapor deposition (CVD).

Figure 17:
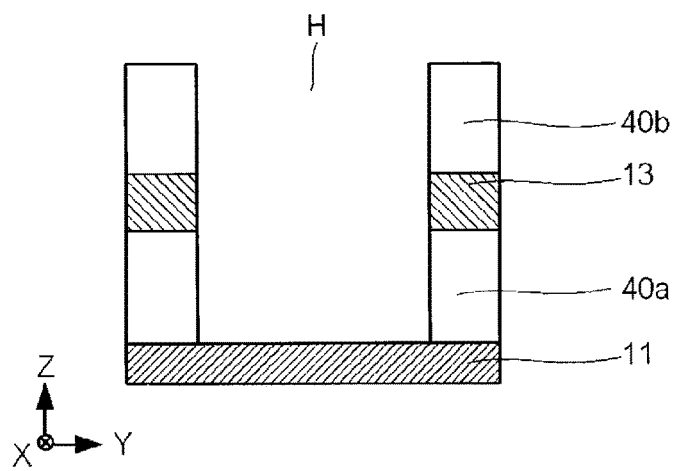

Subsequently, as illustrated in FIG. 17, the stacking of the insulating layer 40a, the conductive layer 13, and the insulating layer 40b is partially processed, to form an opening H. The opening H can be formed by partially etching the stacking with a mask formed, for example, by using a photolithography technique.

Figure 18:
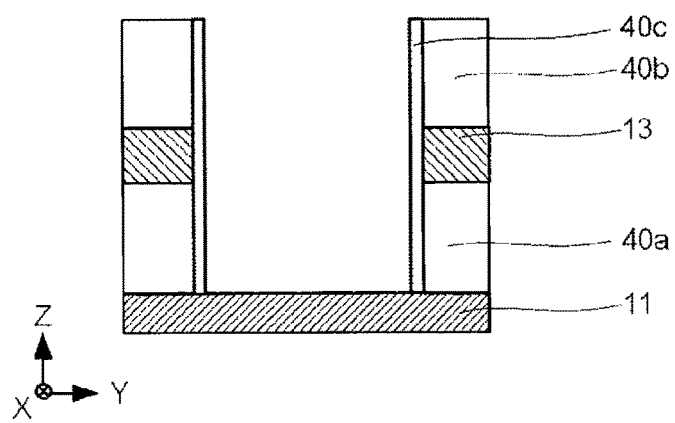

Subsequently, as illustrated in FIG. 18, the insulating layer 40c is formed on the inner wall surface of the opening H. The insulating layer 40c can be formed, for example, by forming insulating films on the inner bottom surface and the inner wall surface of the opening H and partially removing the insulating films by etching back using reactive ion etching (RIE) or dry etching.

Figure 19:
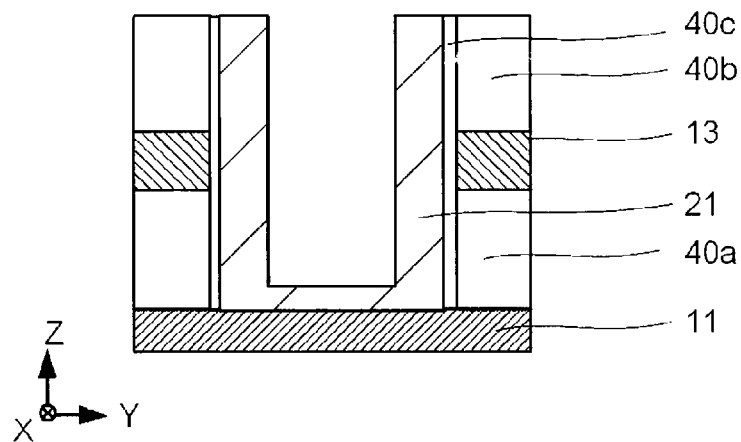

Subsequently, as illustrated in FIG. 19, the semiconductor layer 21 is formed on the insulating layer 40c and the inner bottom surface of the opening. The semiconductor layer 21 can be formed by forming the semiconductor film, for example, by using sputtering or the CVD, and then partially removing the semiconductor film by etching back using RIE or dry etching.

When the memory transistor MTR according to the first modification illustrated in FIG. 6 is formed, a portion of the semiconductor film that is in contact with the inner bottom surface of the opening H is remained by etching back as illustrated in FIG. 19.

Figure 20:
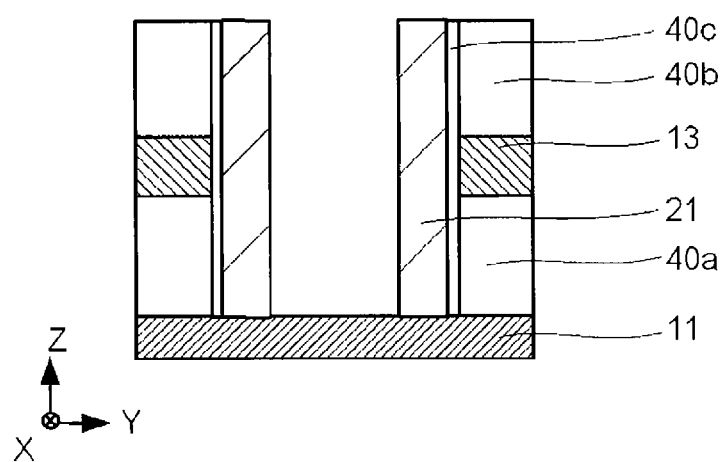

When the memory transistor MTR according to the second modification illustrated in FIG. 7 is formed, the upper surface of the conductive layer 11 in the opening H is exposed by etching back as illustrated in FIG. 20.

Figure 21:
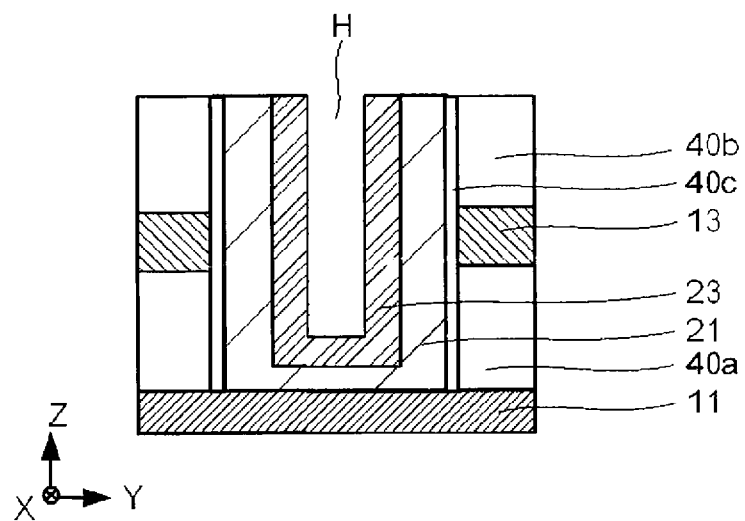

Subsequently, the charge storage film 23 is formed on the semiconductor layer 21 as illustrated in FIG. 21. In addition, when the memory transistor MTR of the structure illustrated in FIG. 8 is formed, the tunnel insulating film 24 is formed on the semiconductor layer 21. When the memory transistor MTR of the structure illustrated in FIG. 9 is formed, the block insulating film 25 is formed on the charge storage film 23. When the memory transistor MTR of the structure illustrated in FIG. 10 is formed, the tunnel insulating film 24 is formed on the semiconductor layer 21, the charge storage film 23 is formed on the tunnel insulating film 24, and the block insulating film 25 is formed on the charge storage film 23. The charge storage film 23, the tunnel insulating film 24, and the block insulating film 25 each can be formed, for example, by using CVD and then formed by partially removing the films by etching back using RIE or dry etching.

In addition, in the memory transistor MTR having the structure illustrated in FIGS. 9 and 10, when the charge storage film 23 does not have a portion that faces the electric conductor 22 in the Z axis direction (a portion between the electric conductor 22 and the conductive layer 11 in the Z axis direction), the structure can be formed by forming the charge storage film 23 along the inner bottom surface and the inner wall surface of the opening H, and then removing the portion along the inner bottom surface while remaining the portion along the inner wall surface by etching back using RIE or dry etching.

Figure 22:
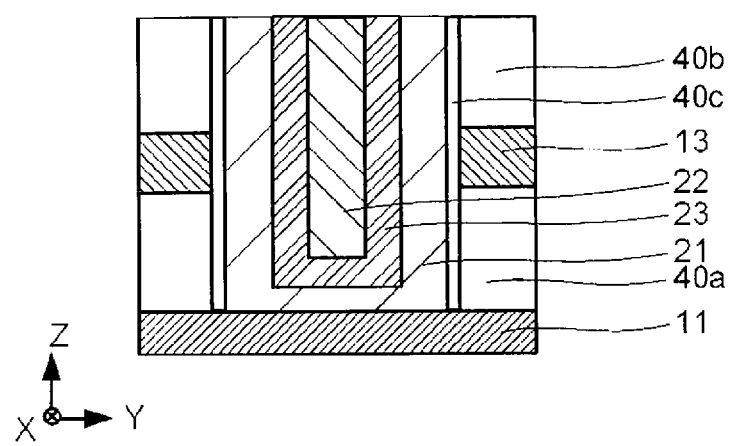

Subsequently, as illustrated in FIG. 22, the electric conductor 22 fills up the opening H. The electric conductor 22 can be formed by forming the electric conductor layer, for example, by using CVD or sputtering and then partially removing the electric conductor layer by etching back using RIE or dry etching.

Figure 23:
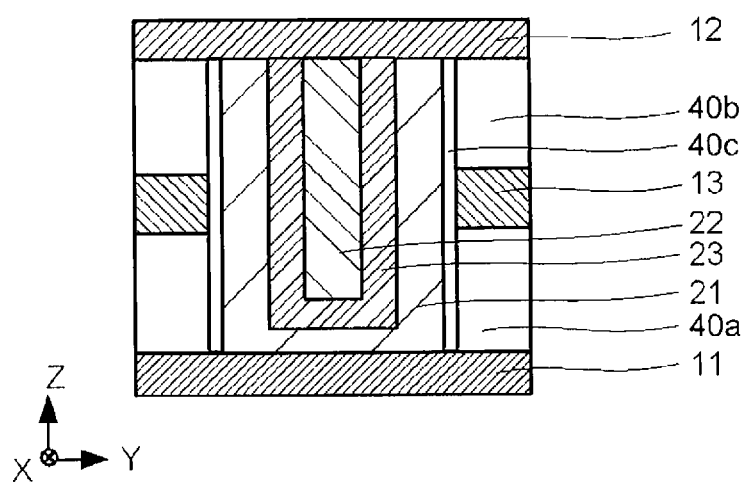

Subsequently, as illustrated in FIG. 23, the conductive layer 12 is formed on the electric conductor 22. The conductive layer 12 can be formed, for example, by using sputtering. The above is the production method example of the memory transistor MTR.

As described above, in the production method of the semiconductor storage device 1 according to the embodiments, even when the memory transistor MTR is formed by the SGT, the back gate of the electric conductor can be easily formed.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a first conductive layer extending along a first direction;
   a semiconductor layer extending along a second direction crossing the first direction, penetrating the first conductive layer, and including an oxide semiconductor;
   a first insulating layer between the first conductive layer and the semiconductor layer;
   a second conductive layer provided on one side of the semiconductor layer in the second direction and electrically connected thereto;
   a third conductive layer provided on the other side of the semiconductor layer in the second direction and electrically connected thereto;
   an electric conductor extending from the third conductive layer toward the second conductive layer along the semiconductor layer; and
   a charge storage film between the semiconductor layer and the electric conductor.

2. The semiconductor device according to claim 1, wherein the third conductive layer extends along a third direction crossing the first and second directions.

3. The semiconductor device according to claim 1, wherein the electric conductor is an electrode in which electron carriers move from the semiconductor layer to the charge storage film when a voltage is applied between the first conductive layer and the electric conductor.

4. The semiconductor device according to claim 1, wherein the electric conductor includes a conductive oxide material, a conductive nitride material, a metal material, or a silicon material.

5. The semiconductor device according to claim 1, wherein the charge storage film includes aluminum oxide, aluminum nitride, silicon nitride, or hafnium oxide.

6. The semiconductor device according to claim 1, wherein the oxide semiconductor of the semiconductor layer includes oxide including at least one element selected from the group consisting of indium, gallium, zinc, and tin.

7. The semiconductor device according to claim 1, wherein the charge storage film extends from the third conductive layer to the second conductive layer along the second direction.

8. The semiconductor device according to claim 7, wherein the charge storage film further extends between the electric conductor and the second conductive layer along a surface of the second conductive layer.

9. The semiconductor device according to claim 1, further comprising:
a second insulating layer between the semiconductor layer and the charge storage film.

10. The semiconductor device according to claim 9, wherein the second insulating layer includes silicon oxide or aluminum oxide.

11. The semiconductor device according to claim 1, further comprising:
a third insulating layer between the electric conductor and the charge storage film.

12. The semiconductor device according to claim 11, wherein the third insulating layer includes silicon oxide or aluminum oxide.

13. The semiconductor device according to claim 1, further comprising:
a second insulating layer between the semiconductor layer and the charge storage film; and
a third insulating layer between the electric conductor and the charge storage film.

14. A semiconductor storage device, comprising:
a memory cell array including a plurality of memory cells each including:
a first conductive layer extending along a first direction,
a semiconductor layer extending along a second direction crossing the first direction, penetrating the first conductive layer, and including an oxide semiconductor,
a first insulating layer between the first conductive layer and the semiconductor layer,
a second conductive layer provided on one side of the semiconductor layer in the second direction and electrically connected thereto,
a third conductive layer provided on the other side of the semiconductor layer in the second direction and electrically connected thereto,
an electric conductor extending from the third conductive layer toward the second conductive layer along the semiconductor layer,
a charge storage film between the semiconductor layer and the electric conductor,
a first electrode electrically connected to the second conductive layer,
a second electrode that faces the first electrode, and
a second insulating layer between the first and second electrodes.

15. The semiconductor storage device according to claim 14, further comprising:
a plurality of first wirings each connected to the first conductive layers of one or more of the memory cells, and
a plurality of second wirings each connected to the third conductive layers of one or more of the memory cells.

16. The semiconductor storage device according to claim 15, further comprising:
a sense amplifier, wherein
the second wirings include a pair of wirings arranged in a line and between which the sense amplifier electrically connected thereto is disposed.

17. The semiconductor storage device according to claim 16, wherein a positive voltage is applied to one of the pair of wirings, and a negative voltage is applied to the other of the pair of wirings.

18. The semiconductor storage device according to claim 15, further comprising:
a sense amplifier, wherein
the second wirings include a pair of wirings extending parallel to each other and electrically connected to the sense amplifier at an end of the pair of wirings.

19. The semiconductor storage device according to claim 14, wherein the second electrode is electrically connected to a power line to which a particular voltage is applied.

* * * * *